United States Patent [19]

Shinbara

[11] Patent Number: 4,788,994

[45] Date of Patent: Dec. 6, 1988

[54] WAFER HOLDING MECHANISM

[75] Inventor: Kaoru Shinbara, Kusatsu, Japan

[73] Assignee: Dainippon Screen Mfg. Co., Japan

[21] Appl. No.: 84,336

[22] Filed: Aug. 11, 1987

[30] Foreign Application Priority Data

Aug. 13, 1986 [JP] Japan .................. 61-190246
Nov. 29, 1986 [JP] Japan .................. 61-285752

[51] Int. Cl.$^4$ .................. C23F 1/02; B05C 11/00; B08B 3/00
[52] U.S. Cl. .................. 134/157; 134/153; 118/54; 156/345
[58] Field of Search ............... 134/140, 153, 154, 157, 134/160, 164; 118/52, 54, 56, 503; 156/345; 204/192.32, 298; 269/903

[56] References Cited

U.S. PATENT DOCUMENTS

| | | | |
|---|---|---|---|
| 4,280,442 | 7/1981 | Johnson | 118/52 |
| 4,439,261 | 3/1984 | Pavone et al. | 156/345 |
| 4,457,419 | 7/1984 | Ogami et al. | |
| 4,473,455 | 9/1984 | Dean et al. | 118/503 X |
| 4,489,740 | 12/1984 | Rattan et al. | 134/140 |

FOREIGN PATENT DOCUMENTS

| | | | |
|---|---|---|---|
| 98574 | 8/1979 | Japan | 118/52 |
| 57-207571 | 12/1982 | Japan . | |
| 132930 | 8/1983 | Japan | 118/52 |

Primary Examiner—Philip R. Coe
Attorney, Agent, or Firm—Ostrolenk, Faber, Gerb & Soffen

[57] ABSTRACT

A wafer holding mechanism horizontally holds, one at a time, wafers which are sequentially transported thereto. Wafers are treated with liquids such as an etchant, rinsing liquid, and the like, at the same time that the wafer is rotated at a high speed. The mechanism includes a hollow rotary shaft having an upper end thrust into a housing, a rotary plate horizontally mounted on the upper end of the rotary shaft, chuck pieces provided on the rotary plate for holding an outer peripheral edge of the wafer, the chuck pieces being movable in the radial direction of the rotating plate between a holding position wherein the wafer is tightly held by the chuck pieces and a release position wherein the wafer is free to be removed from the chuck pieces.

20 Claims, 10 Drawing Sheets

WAFER HOLDING MECHANISM

FIELD OF THE INVENTION AND RELATED ART STATEMENT

The present invention relates to a mechanism for rotatingly holding thin plate substrates such as semiconductor substrates, glass substrates for use as electrodes in liquid crystal displays or photomasks employed in the production of semiconductor devices and integrated circuits, and the like (generically referred to as wafers hereinafter), in an apparatus for surface treating wafers which effects the subject surface treating by horizontally holding, one at a time, each of the wafers being transported thereto consecutively and furnishing required treating liquids to a surface thereof while holdingly rotating the wafer at a high speed.

Generally, the wafer holding mechanism in such apparatus is broadly classified into two types. One is a so called vacuum chuck type that conducts vacuum-suction to one side surface of the wafer, and the other is a type that holds the outer peripheral edge of the wafer by means of three or more chuck pieces. Since the treating can be applied to only one side surface of the wafer according to the former, the latter is chiefly employed when it is desired to treat both side surfaces simultaneously.

In this connection, Japanese patent application Kokai No. 57-207571 discloses the latter type of wafer holding mechanism. According to this prior art mechanism, however, there are so arranged wafer releasing members and springs for giving force to move movable chuck pieces in a direction to hold the wafer, as to be directly exposed to the inside of a treating chamber per se, or susceptible to the conditions thereof of the surface treating apparatus. Consequently, when high corrosive treating liquids are employed for the surface treating, the springs are corroded to produce dust that will attach to the wafer and cause decreased yields and/or diminish the durability of the releasing members etc.

SUMMARY OF THE INVENTION

With a view to solving the aforementioned problems, it is an objective of the present invention to provide a novel and improved wafer holding mechanism in an apparatus for surface treating wafers while rotating the same.

It is another objective of the invention to provide a wafer holding mechanism in an apparatus for surface treating wafers while rotating the same wherein low corrosion-resistant members are disposed outside of and remotely from the treating chamber of the apparatus so as not to be adversely affected by, for example, the treating liquids being applied on the surface of the wafer.

To accomlish the above objectives, there is provided, in accordance with an aspect of the invention, a wafer holding mechanism in an apparatus for surface treating wafers while rotating the same, which mechanism comprises: a housing defining a treating chamber in the apparatus; a hollow rotary shaft having an upper end thrust into the housing; a rotary plate member horizontally mounted on the thrust end of the rotary shaft and formed with at least three radially projecting arms; chuck members provided on the respective arms for holding an outer peripheral edge of a wafer altogether, at least one of the chuck members being horizontally movable along the arm; a shaft insertingly mounted in the rotary shaft and being rotatable relative to the rotary shaft for driving the movable chuck member to hold the wafer; a link member having one end thereof connected to an upper end of the driving shaft eccentrically to a rotary axis of the driving shaft and the other end thereof linked with the movable chuck member; means associated between lower portions of the rotary and driving shafts for perpetually energizing the driving shaft to rotate relative to the rotary shaft in a direction to drive the movable chuck member to hold the wafer through the link member; and means disposed adjacently to the energizing means for forcing the movable chuck member to release the wafer, the forcing means being actuated to rotate the driving shaft in a direction reverse to the direction in which the driving shaft is energized to rotate by the energizing means.

In a preferred embodiment, the movable chuck member is secured to a sliding member which is mounted slidably along the arm and linked with the other end of the link member, while the other chuck members are fixed on the arms, and further a balancing member of the same weight as that of the sliding member is disposed symmetrically with the sliding member relative to the rotary axis of the driving shaft and mounted slidably along the arm.

In another preferred embodiment, the balancing member is linked with one end of another link member the other end of which is connected with the one end of the link member on the upper end of the driving shaft.

In still another preferred embodiment, the chuck members are shaped to be different in height, and there are provided wafer placing pins radially inwardly of a circle defined by end of all the arms relative to the chuck members.

In yet another preferred embodiment, the energizing means comprises a spring connected between pins formed on the lower portions of the rotary and driving shafts respectively for perpetually pulling both the pins toward each other to give force rotate the driving shaft relative to the rotary shaft.

In a further preferred embodiment, the forcing means comprises an air cylinder for pushing another pin formed on the lower portion of the driving shaft to rotate the driving shaft relative to the rotary shaft in the reverse direction.

Preferably, the forcing means comprises a cam member disposed beneath a lowermost end of the driving shaft for engaging with a follower formed on the lower portion of the driving shaft as the rotary shaft descends, so as to rotate the driving shaft relative to the rotary shaft in the reverse direction.

More preferably, the movable chuck member is rotatable relative to the arm and fixed to a swinging member with which is connected the other end of the link member whereby the movable chuck member is rotated to hold the wafer by the swinging member when the swinging member is swung in association with a rotation of the driving shaft via the link member.

Still preferably, the movable chuck member is shaped of a wafer placing part and a chuck part.

Yet preferably, the chuck part of the movable chuck member is formed with cut-outs.

Further preferably, the chuck part of the movable chuck memberis shaped of a substantially small column formed on the placing part eccentrically to a rotary axis of a body of the movable chuck member.

In accordance with another aspect of the invention, there is provided a wafer holding mechanism in an apparatus for surface treating wafers while rotating the same, which mechanism comprises: a housing defining a treating chamber in the apparatus; a hollow rotary shaft having an upper end thereof thrust into the housing; a rotary plate member horizontally mounted on the thrust end of the rotary shaft; at least three chuck members provided on the plate member for holding an outer peripheral edge of a wafer altogether, at least one of the chuck members being movable radially of and along the plate member; a shaft insertingly mounted in the rotary shaft and being rotatable relative to the rotary shaft for driving the movable chuck member to hold the wafer; a link member having one end thereof connected to an upper end of the driving shaft eccentrically to a rotary axis of the driving shaft and the other end thereof linked with the movable chuck member; means associated between lower portions of the rotary and driving shafts for perpetually energizing the driving shaft to rotate relative to the rotary shaft in a direction to drive the movable chuck member to hold the wafer through the link member; and means disposed adjacently to the energizing means for forcing the movable chuck member to release the wafer, the forcing means being actuated to rotate the driving shaft in a direction reverse to the direction in which the driving shaft is energized to rotate by the energizing means.

In a preferred embodiment, the movable chuck member is secured to a sliding member which is mounted slidably radially of and along the rotary plate member and is linked with the other end of the link member, while the other chuck members are fixed on the plate member, and further a balancing member of the same weight as that of the sliding member is disposed symmetrically with the sliding member relative to the rotary axis of the driving shaft and mounted slidably radially of and along the plate member.

In another preferred embodiment, the balancing member is linked with one end of another link member the other end of which is connected with the upper end of the driving shaft eccentrically to the rotary axis of the driving shaft.

In still another preferred embodiment, the movable chuck member is vertically passed with a clearance through an opening formed in the plate member and fixed on the sliding member, and the balancing member has a pin vertically passed with a clearance through another opening formed in the plate member.

In accordance with still another aspect of the invention, there is provided a wafer holding mechanism in an apparatus for surface treating wafers while rotating the same, which mechanism comprises: a housing defining a treating chamber in the apparatus; a hollow rotary shaft having an upper end thereof thrust into the housing; a rotary plate member horizontally mounted on the thrust end of the rotary shaft; chuck members disposed symmetrically relative to a rotary axis of the rotay shaft for holding an outer peripheral edge of a wafer altogether, at least one of the chuck members mounted slidably radially of and along the plate member; a shaft insertingly mounted in the rotary shaft and being movable axially of and relative to the rotary shaft for driving the slidable chuck member; and a cam member mounted on an upper end of the driving shaft; a link member having formed at one end thereof a follower engaged with the cam member and the other end thereof fixed to the chuck member, the link member being horizontally moved along the plate member integrally with the chuck member as the follower follows an axial motion of the driving shaft relative to the rotary shaft engagingly with the cam member; means associated between lower portions of the rotary and driving shafts for stationary keeping the driving shaft relative to the rotary shaft so as to continuously cause the chuck members to hold the wafer; and means provided at a lower end of the driving shaft for forcing the chuck members to release the wafer through the link member when the driving shaft moves axially of and relative to the rotay shaft.

In a preferred embodiment, the keeping means comprises a spring connected between the lower portions of the rotary and driving shafts for pulling both the portions toward each other axially of the roatry shaft.

In a further preferred embodiment, the forcing means comprises a pin projecting downwardly of the lower end of the driving shaft.

Preferably opposite two of the chuck members are secured on two sliding members mounted radially of and along the rotary plate member.

Hence, according to the invention, low corrosion-resistant members can be disposed outside of and remotely from the treating chamber of the apparatus for surface treating wafers while rotating the same, so as not to be adversely affected by, for example, the treating liquids being applied on the surface of the wafer. Consequently, the mechanism is free from the production of the dust that will attach to the wafer being treated and cause, a reduction of the yield thereof, and eventually the corrosion-resistance of the mechanism per se can be dramatically enhanced.

BRIEF DESCRIPTION OF THE DRAWINGS

The foregoing and the other objectives and attendant advantages of the present invention will be readily appreciated as the same becomes better understood by reference to the following detailed description when considered by the accompanying drawings, wherein.

DETAILED DESCRIPTION OF THE PREFERRED EMBODIMENTS

Figure 1:
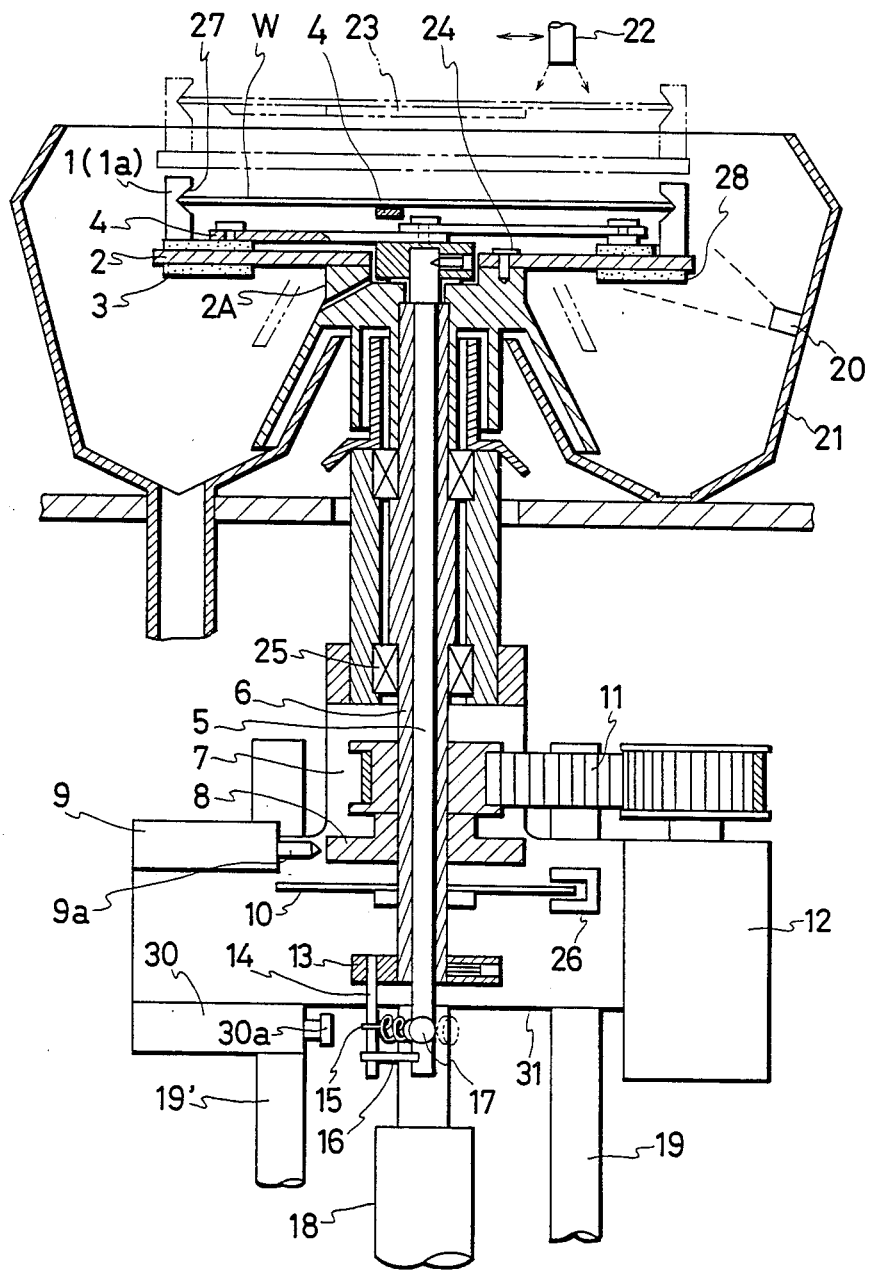
FIG. 1 is a first preferred embodiment of the wafer holding mechanism in the apparatus for surface treating the wafers while rotating the same.

Now referring to the drawings, there are described below preferred embodiments of the invention.

Figure 2:
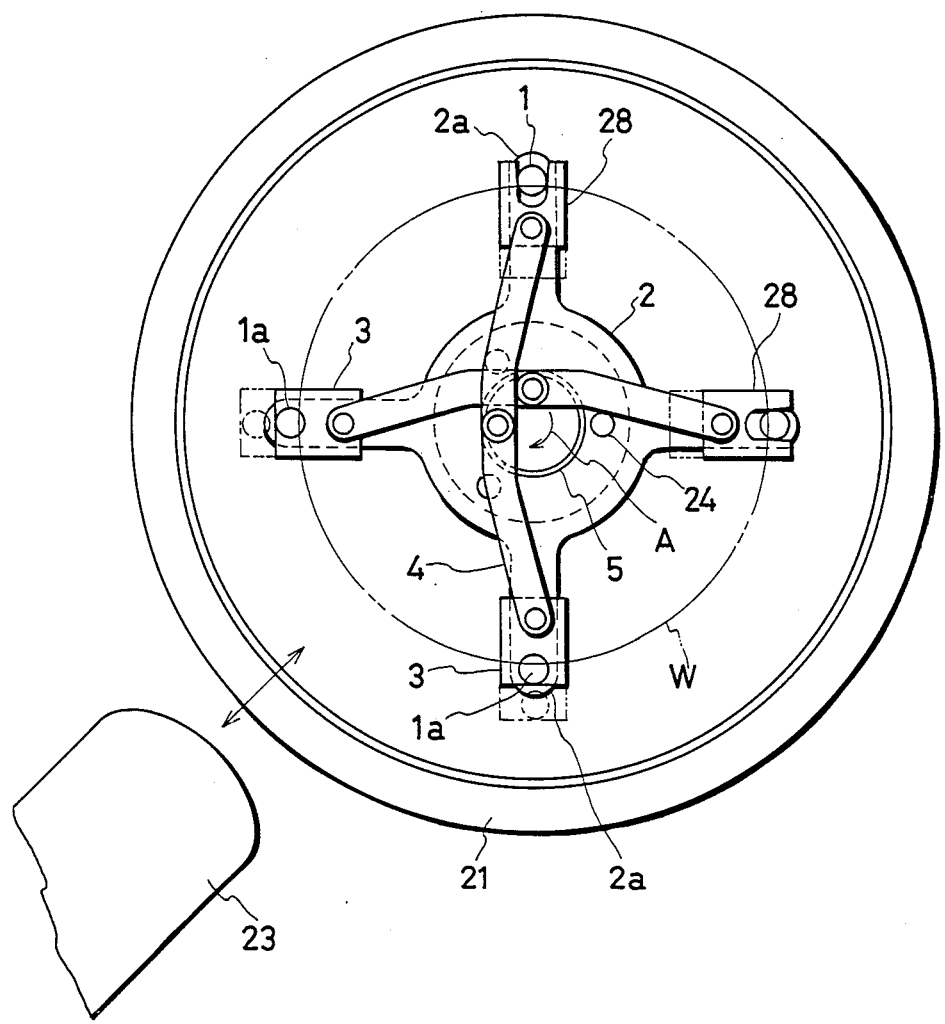
FIG. 2 is a top plan view of the mechanism of FIG. 1.

FIG. 1 is a first embodiment of the wafer holding mechanism in the apparatus for surface treating the wafers while rotating the same in accordance with an aspect of the invention, and FIG. 2 is a top plan view of the mechanism of FIG. 1

The mechanism generally constitutes of a housing 21 that defines a treating chamber in the apparatus for surface treating the wafers; a rotary shaft 6 rotatably designed and having one end thereof thrust into the housing 21; a rotary plate 2 provided near the thrust end of the shaft 6; four chuck pieces 1 disposed on the plate 2 symmetrically with respect to a rotary axis of the plate for holding altogehter the outer peripheral edge of a wafer W being treated two opposite pairs 1a of the chuck pieces which are movably designed; a spring 15 for exerting a force to move the movable pieces 1a in a direction to hold the wafer; and an air cylinder 30 for moving the pieces 1a in a direction to release the wafer repulsively to the force by the spring 15.

The rotary plate 2 is horizontally secured removably to a rotary head 2A, which is fixed to the thrust end of the shaft 6, by means of a bolt 24. The plate 2 can be replaced with other plates which are suitable for the size of the wafer. Furthermore, the plate 2 is formed with four radially projecting arms 2a. At the ends of two arms 2a are fixed two chuck pieces 1, respectively, while on sliders 3 (which are horizontally slidable along the arms, there are secured two chuck pieces 1a to be movable integrally with the sliders 3. Reference numerals 28 denote balancers which are of substantially the same shape and weight as those of the sliders 3 and which are disposed symmetrically with the sliders relative to the rotary and are axis slidable along the arms 2a and which are further connected with the sliders 3 via movable chuck piece operation links 4 described below.

The cylindrically shaped shaft 6 receives a movable chuck piece driving shaft 5 which is rotatable relative to the shaft 6. The shaft 6 is rotatably supported by a base 31 by means of a bearing 25, and is driven to rotate by a driving motor 12 installed on the base 31 through a belt 11 and a pulley 7.

The rotating shaft 6 is locked by means of a flange 8 and an air cylinder 9 when it reaches a stopping position which is detected by means of a disc 10 and a photoelectric sensor 26. The disc 10 is formed with a cut-out indicating the locking position and is fixed on a lower portion of the shaft 6. The photoelectric sensor 26 detects the cut-out. Meanwhile, the flange 8 is secured to the shaft 6 and an air cylinder 9 is provided on the base 31 at a position corresponding to the flange 8. The locking of the shaft 6 is effected by fitting an end of an output rod 9a of the cylinder 9 into a concave recess formed on the flange 8.

Each slider 3 and its opposing balancer 28 are linked by a pair of links 4 with one end of each link being joined to the other. The joined ends of links 4 are connected on the upper end of the drive shaft 5 eccentrically to the rotary axis of the shaft 5. The other ends of the links 4 are connected to the slider 3 and balancer 28, respectively. Accordingly, when the the shaft 5 rotates relative to the shaft 6, the movable chuck pieces 1a are operated, i.e. the pieces 1a are slided along the arms 2a integrally with the sliders 3 through the links 4.

The shafts 5 and 6 are biased by spring 15 to cause relative rotation of the shafts in a direction which causes the chuck pieces 1 to hold the wafer W altogether. Particularly, the spring 15 connects a pin 14, projecting downwardly of the flange 13 formed on the lower end of the shaft 6, and a pin 17, formed on the lower portion of the shaft 5, and pulls the pins 14 and 17 toward each other. The force produced by the spring 15 may be adjusted by altering the position of the flange 13 relative to the shaft 6 to change the distance between the pins 14 and 17. On the lower portion of the shaft 5 there is formed another pin 16 for stopping the rotation of the shaft 5 with reference to the shaft 6 by abutting against the pin 14 when the chuck pieces 1 do not hold the wafer W. If desired, there may be provided a suitable detection means for detecting whether or not the pins 14 and 16 abut with each other so as to determine whether the wafer W is held.

It is also possible to provide a disc formed with a cut-out on the lower portion of the driving shaft 5 and to cause the cut-out to be detected by a photosensor in order to determine whether (a) the movable chuck pieces are in the wafer releasing position, or (b) the wafer is actually held by the chuck pieces, or (c) the movable chuck pieces are in the wafer holding position without any wafer being held whatsoever. With this structure, the wafer can be can be unambiguously brought into and out of the apparatus in the case of (a), rotated in the case of (b), and the apparatus can be disabled in the case of (c) respectively. Consequently, any wafer which is not held stably or firmly can be prevented from rotating.

The air cylinder 30 has an output rod 30a designed to confront the pin 17 that is connected with one end of the spring 15. When the cylinder 30 rotates the shaft 5 counterclockwise by pushing the pin 17 to a position depicted by in phantom in FIG. 1 against the force acting on the pin 17 by the spring 15, the movable chuck pieces 1a formed on the sliders 3 are moved to wafer-releasing positions indicated in phantom in FIG. 2 integrally with the sliders through the links 4.

The base 31 for supporting the holding mechanism is arranged to be movable up and down along a pair of guides 19 and 19' and is driven to ascend and descend by an air cylinder 18. When the cylinder 18 is stretched to move the base 31 up, the chuck pieses 1 are moved to positions denoted in phantom in FIG. 1 which are higher than the top of the housing 21, so that an exchange of the wafer is possible.

Reference numeral 23 designates a transporting arm of a wafer-transporting device(not shown), 20 a nozzle provided on the inner wall of the housing 21 for spouting treating liquids onto a lower surface of the wafer W, and 22 another treating liquid jetting nozzle that is suspended above the rotary head 2A in a manner to be horizontally movable. These nozzles 20 and 22 are individually connected with treating liquid suppling means (not indicated) and thus the required treating liquids are furnished therethrough to the upper and lower surfaces of the wafer W. If desired, a treating liquid supplying path may also be formed through the shaft 5 with a nozzle provided on the upper end of the path for spouting the liquids to the lower surface of the wafer W.

Described hereunder in detail is the wafer holding operation of the mechanism according to the invention.

The wafer W having undergone pre-aligning at a predetermined position (not shown) is moved above the housing 21 by the arm 23. Meanwhile, the shaft 6 is, after being roughly positioned by means of the disc 10 and the photoelectric sensor 26, made stationary, and then is accurately positioned by inserting the end of the rod 9a of the cylinder 9 into the concave groove formed in the flange 8.

Thereafter, the air cylinder 30 is actuated to push the pin against the force of spring 15 so as to rotate the shaft 5 relative to the shaft 6 by a predetermined amount, with the result that the sliders 3 are slid from positions indicated in solid-lines to the positions indicated in phantom in FIG. 2 for the purpose of enlarging the distance between the two chuck pieces 1a located closer to the arm than the other chuck pieces.

Next, the base 31 is moved up by extending the cylinder 18 until the chuck pieces 1 ascend up to the positions shown in phantom in FIG. 1, namely until the concave notches 27 formed on the pieces 1 reach the same height as that of the wafer W being held by the arm 23.

Thereafter, the cylinder 30 is retracted to permit the shaft 5 to return to its initial position in response to the force exerted by the spring 15 and thereby pull the pins 14 and 17 of the shafts 5 and 6 toward each other so as to slide the sliders 3 to the solid line positions in FIG. 2. This permits the chuck pieces 1 to hold the outer peripheral edge of the wafer W within the notches 27 thereof. At this time, the operator may confirm whether or not the wafer is held by the chuck pieces 1 in cases where a sensor (not shown) is provided for detecting the abutting of the pin 16 against the pin 14.

Subsequently, the chuck pieces 1 are caused to further ascend by extending the air cylinder 18 in order to form a space between the arm 23 and the lower surface of the wafer W, allowing the arm 23 to move from its position under the lower surface of the wafer W. The cylinder 18 is then retracted to move down the base 31 so that the wafer W descends to the position indicated by solid lines in FIG. 1 to be accomodated within the housing 21.

The cylinder 9 is then contracted to remove the output rod 9a from the concave groove formed on the flange 8 and the motor 12 is driven to rotate the shaft 6. The shaft 5 is at this time rotated integrally with the shaft 6 since these shafts are connected by the spring 15, which means that the wafer W is rotated while being horizontally held by the chuck pieces 1.

Then, the required surface treating liquids such as an etchant, developing liquid, rinsing liquid, and the like are jetted onto the upper surface of the wafer from the nozzle 22 which has been moved above the center of the wafer W, thus effecting the surface treating of the wafer W. In the meantime, the lower surface of the wafer W may be simultaneously sujbected to the treatment by jetting the liquids onto the lower surface from the nozzle 20 provided on the inner wall of the housing 21, if desired.

A load applied on the slider 3 is not varied during the rotation, since the centrifugal force acting on the slider 3 is equalized with that of the balancer 28 disposed symmetrically with respect to the slider 3 relative to the rotary axis of the rotary shaft 6, thus achieving the stable rotation of the wafer W. After the required surface treatments of the wafer W are completed, the shaft 6 is stopped such that the cut-out of the disc 10 and the photoelectric sensor 26 face each other, and the accurate positioning of the shaft 6 is performed by actuating the cylinder 9 to insert its rod 9a into the concave groove formed in flange 8.

Next, after the cylinder 18 is extended to move the wafer W upward, the arm 23 is moved toward and beneath the wafer W and subsequently the cylinder 30 is actuated to enlarge the distance between those chuck pieces 1a which confront the arm 23, so that the wafer W is placed on the arm 23. Thereafter, the wafer W is removed from the apparatus by the arm 23.

Thus, each wafer, after transported by the arm 23 to the apparatus sequentially one at a time, is subjected to the treatment by repeating the same procedures as set forth above.

Figure 3:
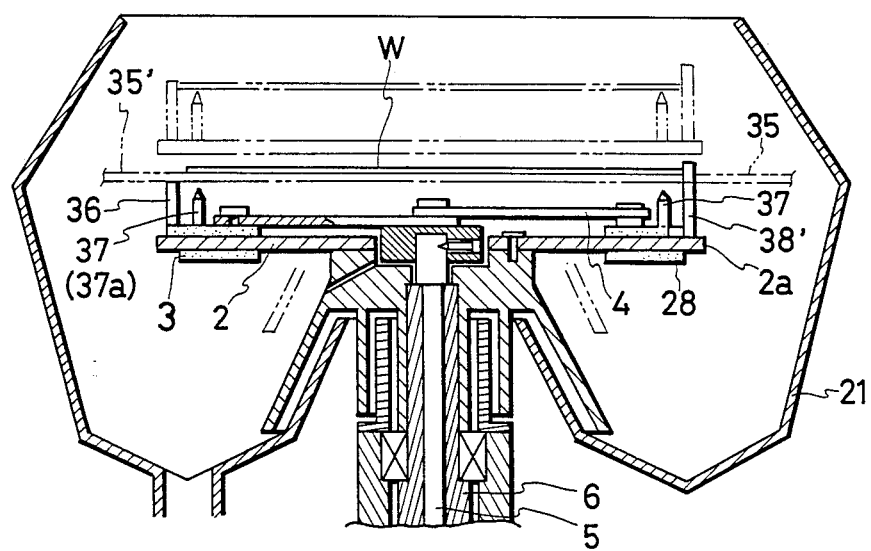
FIG. 3 is a vertical sectional view depicting a second preferred embodiment of the mechanism according to the invention.
Figure 4:
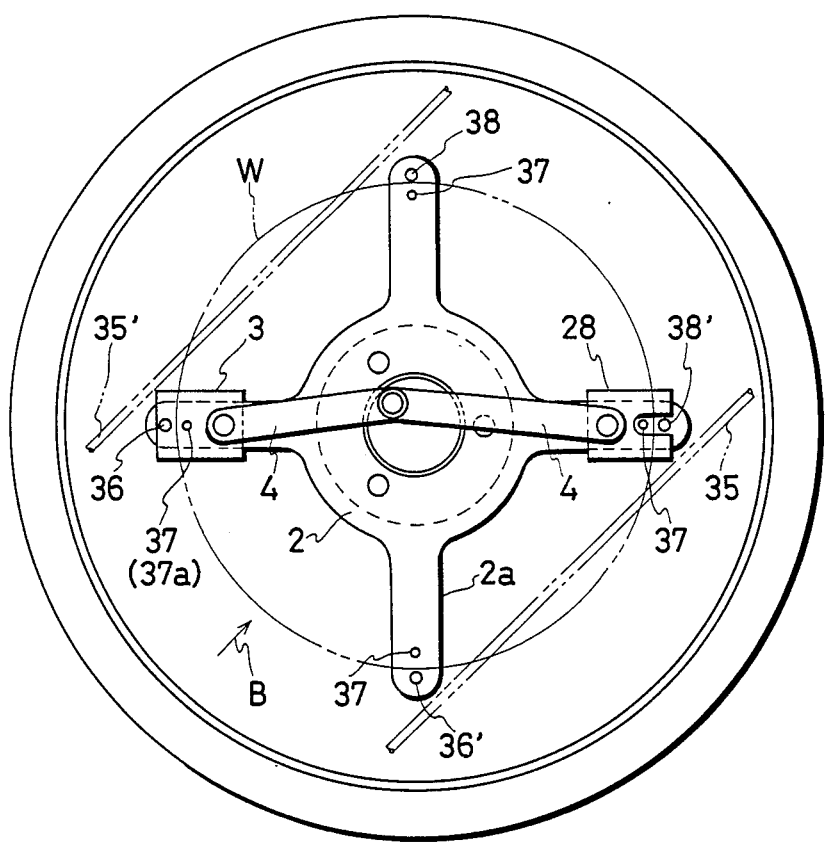
FIG. 4 is a top plan view of the mechanism of FIG. 3.

FIG. 3 is a vertical sectional view depicting a second preferred embodiment of the wafer holding mechanism according to the invention and FIG. 4 is a top plan view of the mechanism of FIG. 3, in which like reference characteristics designate like or corresponding parts of the mechanism shown in FIGS. 1 and 2.

Reference numerals 35 and 35' denote a pair of endless belts (shown in phantom) for carrying the wafers W, which are stretchingly provided between pulleys (not shown) equipped within the housing 21. In the meantime, the housing 21 has an entrance and an exit (not indicated) for transporting the wafers W into and out of the housing at positions corresponding to the belts 35 and 35'. Closing doors are provided at the entrance and exit, respectively.

As in the first embodiment, four chuck pieces 36, 36', 38, and 38' are provided. However, only the single chuck piece 36 is formed on the slider 3 in a manner to be movable integrally with the slider 3. The other three chuck pieces are fixed on the arms 2a of the rotary plate 2. The chuck pieces 36 and 36' which are disposed upstream of a direction (denoted by an arrow B in FIG. 4) to carry the wafers into the housing are fashioned to be shorter than the pieces 38 and 38' disposed downstream of the direction, in order that the latter can serve as wafer positioning pins. Moreover, there are provided four wafer placing pins 37, which are still shorter than the pieces 36 and 36', radially inwardly of a circle defined by ends of all the arms 2a with reference to these four chuck pieces. Among the pins 37, one pin 37a is fixed on the slider 3. Accordingly, the wafer W is horizontally carried above the shorter pieces 36 and 36' by the belts 35 and 35' until the wafer abuts against the taller pieces 38 and 38', so as to be positioned thereby. Then, the wafer is transferred onto the pins 37 from the belts 35 and 35' after the air cylinder 18 is extended to raise the chuck pieces and the pins to positions indicated in phantom in FIG. 3. Subsequently, a wafer releasing arrangement described below is made inoperative to cause the chuck pieces 36, 36', 38, and 38' to hold the wafer altogether.

Figure 5:
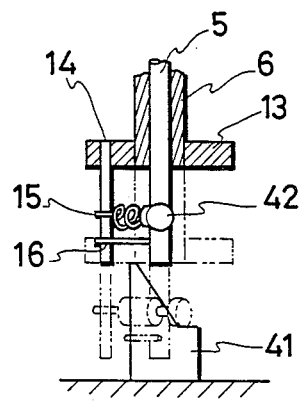
FIG. 5 is a sectional view showing essential parts of a wafer releasing arrangement of the second embodiment.
Figure 6:
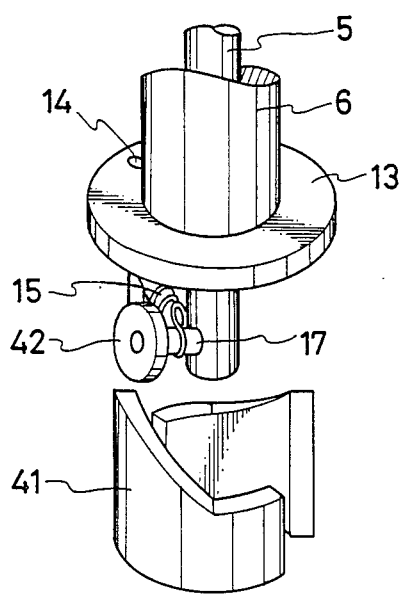
FIG. 6 is a perspective view of the arrangement of FIG. 5.

Specifically, as illustrated in FIGS. 5 and 6, a roller 42 is rotatably coupled to the pin 17 of the shaft 5 and which rides on a cam 41, located beneath the lowermost end of the shaft 5, when the shaft 6 descends. Accordingly, the roller 42, as the shaft 6 descends, forces the shaft 5 to rotate relative to the shaft 6 against the force by the spring 15, so that the slider 3 slides to enlarge the distance between the chuck pieces 36 and 38' as shown in FIG. 4. In contrast, when the shaft 6 ascends as depicted in solid lines of FIG. 5, the roller 42 is removed from the cam 41 so that the action of the force on the shaft 5 by the spring 15 is recovered to slide the slider 3 horizontally toward the rotary axis of the shaft 5 via the link 4, thereby permitting the chuck pieces 36 and 38' to hold the wafer.

Although the rotary plate 2 is formed with four arms 2a in these two embodiments, an arrangement may be made that the plate is formed with at least three arms spaced at regular intervals.

Figure 7:
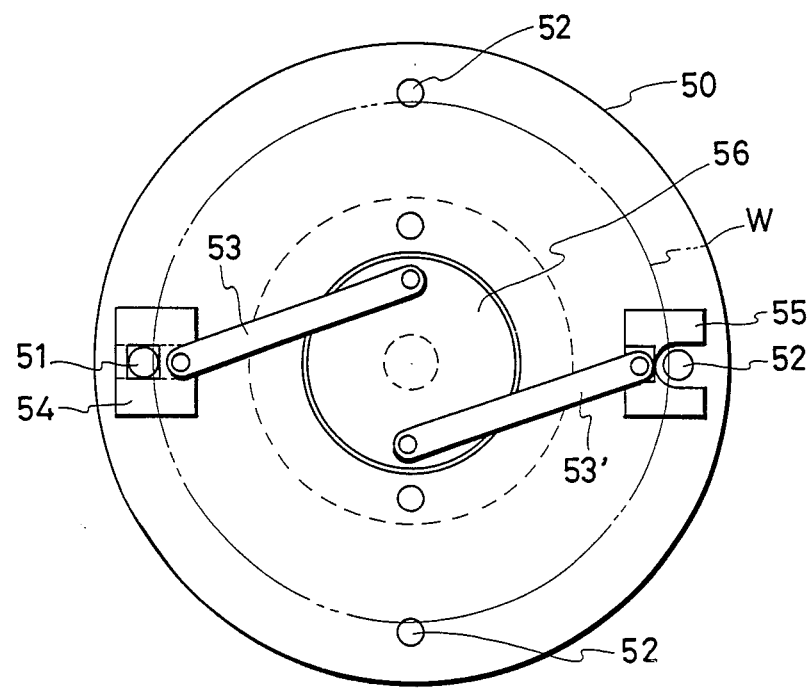
FIG. 7 is a top plan view illustrating a third preferred embodiment of the mechanism according to the invention.
Figure 8:
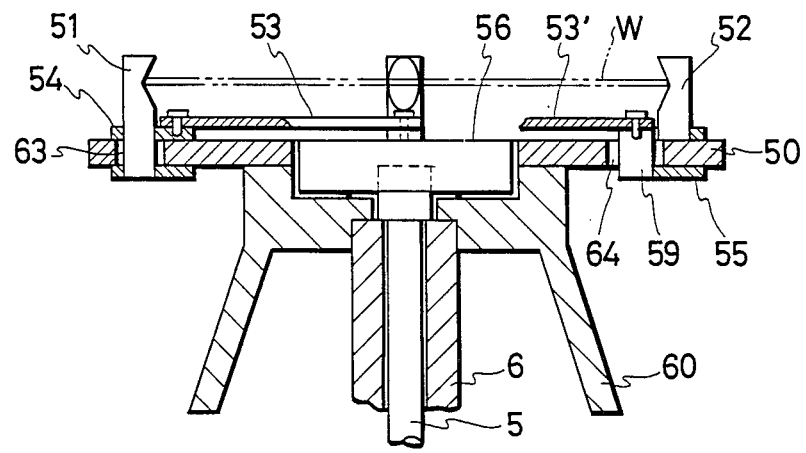
FIG. 8 is a vertical sectional view depicting essential parts of the mechanism of FIG. 7.

FIG. 7 is a top plan view showing a third preferred embodiment of the mechanism according to the invention, and FIG. 8 is a vertical sectional view illustrating essential parts of the mechanism of FIG. 7.

The differences between the third embodiment and the first embodiment are described below.

Unlike the case of the first embodiment, no arms are provided on the rotary plate 50. One chuck piece 51 is formed on a slider 51, while three chuck pieces 52 are fixed on the rotary plate 50. The piece 51 passes vertically with a clearance through an opening 63 formed in the plate 50 and is fixed on the slider 54, which is mounted slidably radiably of and along the rotary plate 50, to be movable integrally with the slider to hold the wafer. The slider 54 is joined with an upper end portion 56 of the shaft 5 through a chuck operation link 53. Reference numeral 55 denotes a balancer disposed symmetrically with the slider with respect to the rotary axis of the driving shaft 5 and having a pin 59 passing with a clearance through an opening 64 in the plate 50. The balancer 55 is similarly joined with the upper end portion 56 of the shaft 5 via a link 53'. Thus, the centrifugal forces applied on the slider 54 and the balancer 55 during rotation are equalized.

If desired, one of chuck pieces 52 that confronts the piece 51 may be fixed on the balancer 55 to be movable integrally with the balancer.

Figure 9:
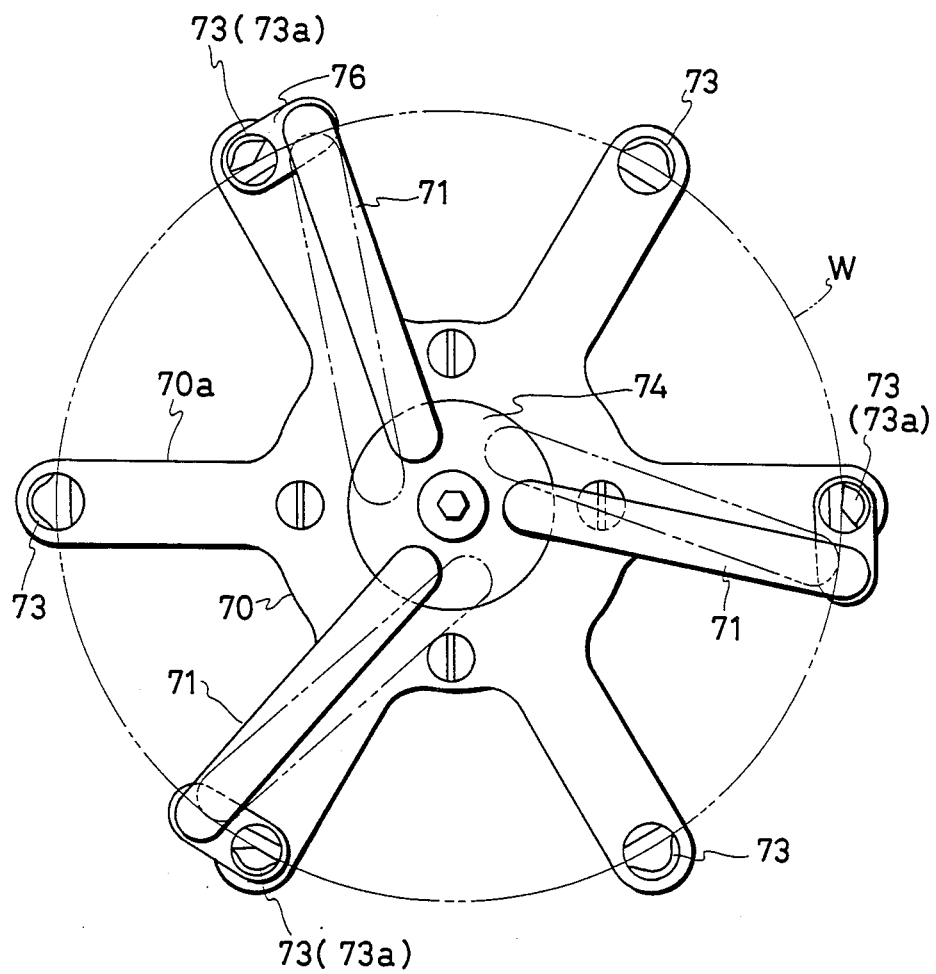
FIG. 9 is a top plan view showing essential parts of the mechanism according to a fourth preferred embodiment of the invention.
Figure 10:
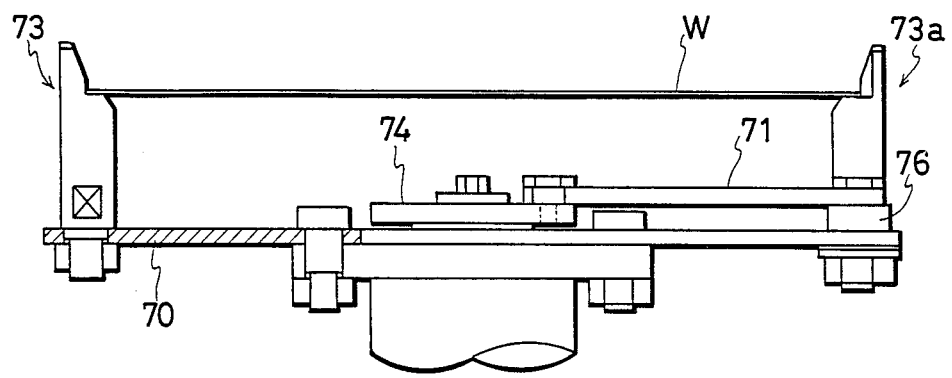
FIG. 10 is a vertical sectional view illustrating the essential parts of FIG. 9.
Figure 11:
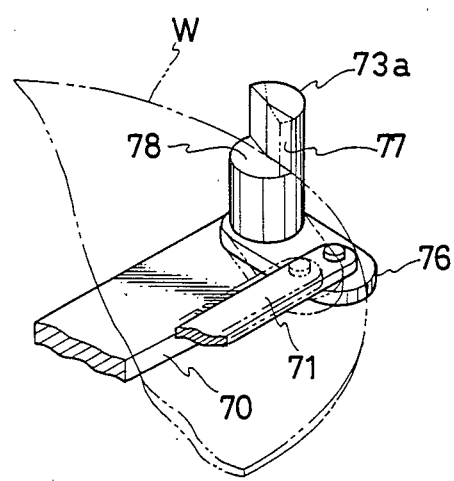
FIG. 11 is a perspective view showing an example of a movable chuck piece employed in the fourth embodiment.

FIG. 9 is a top plan view depicting essential parts of the mechanism according to a fourth preferred embodiment of the invention, FIG. 10 is a vertical sectional view illustrating the essential parts of FIG. 9, and FIG. 11 is a perspective view showing an example of a movable chuck piece employed in the fourth embodiment.

The differences between the fourth embodiment and the first embodiment are described below.

A rotary plate 70 is formed with six radially and horizontally projecting arms 70a, on whose ends are provided six chuck pieces 73 respectively. Of these chuck pieces 73, three pieces 73a are designed movably, while the other pieces are fixed on the ends of the arms 70a. The fixed and movable chuck pieces are alternately disposed circumferentially of a circle defined by the ends of all the arms 70a.

An upper part of the movable chuck piece 73a is suitably shaped to hold the wafer, while a lower part thereof is secured to a swinging arm 76 and accordingly the piece 73a is rotatable relative to the arm 70a. The arm 76 is connected to one end of a movable chuck piece operation link 71 the other end of which is linked with a disc 74 fixed to the movable chuck piece driving shaft 5, and hence the arm 76 is swung by the shaft 5 through the link 71. Thus the movable chuck pieces 73a are rotated on and relative to the arms 70a to hold the wafer by the swinging arm 76 when the arm 76 is swung in association with a rotation of the driving shaft 5 via the links, as shown by imaginary lines in FIG. 9. The upper part of the movable chuck piece 73a includes a wafer placing portion 78 and a chuck portion 77 formed with cut-outs for holding the wafer W, and thus the wafer W is, when placed on the portion 78, held by the portion 77 cooperatively, as denoted by imaginary lines in FIG. 11.

Figure 12:
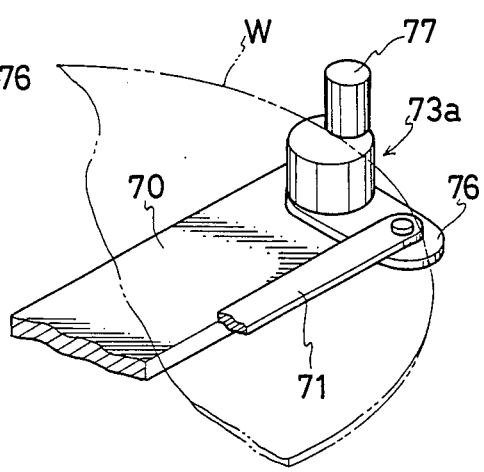
FIG. 12 is a perspective view depicting a variant form of a chuck portion of the chuck piece of FIG. 11.

FIG. 12 is a perspective view showing a variant form of the chuck portion 77 of the chuck piece 73a of FIG. 11, in which the portion 77 is formed of a small column disposed eccentrically to the rotary axis of the body of the piece 73a.

While the spring 15 in this embodiment exerts a force acting in a direction reverse to that of the first embodiment, the acting force by the spring 15 may be freely set in either direction when the movable chuck pieces 73a of FIGS. 11 and 12 are employed.

Figure 13:
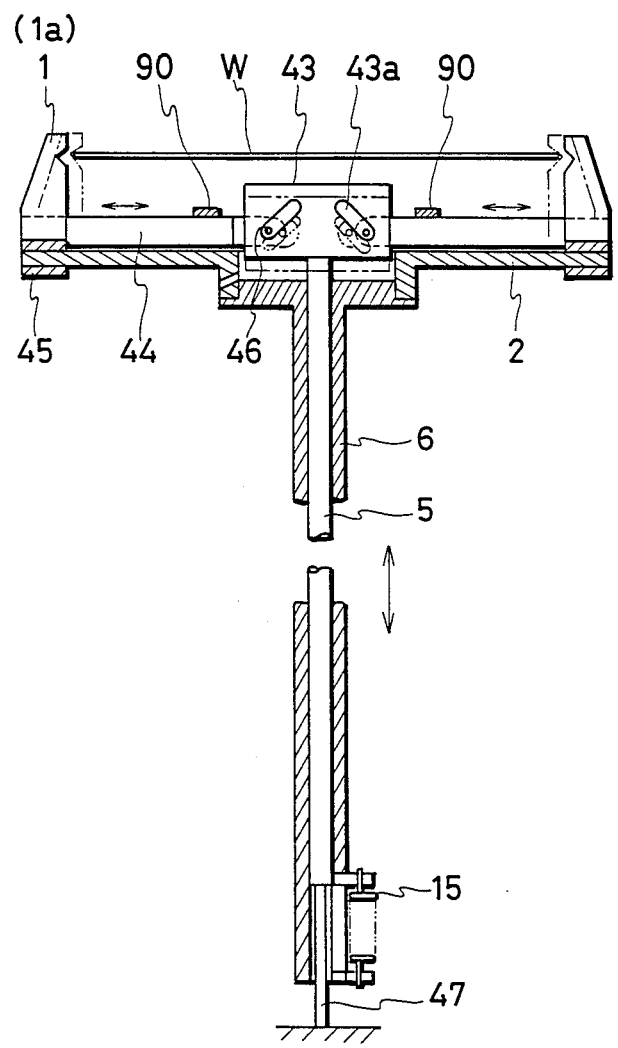
FIG. 13 is a vertical sectional view showing essential parts of the mechanism according to a fifth preferred embodiment of the invention.

FIG. 13 is a vertical sectional view depicting essential parts of the mechanism according to a fifth preferred embodiment of the invention. In this embodiment, the driving shaft 5 is arranged to be slidable with reference to the rotary shaft 6 axially of the shaft 6, and among four chuck pieces 1 symmetrically disposed on the rotary plate 2 relative to the driving shaft 5, two opposite chuck pieces 1a are formed on sliders 45 respectively which are mounted slidably radially of and along the plate 2 so as to equilibrate the centrifugal force applied on both the pieces 1a during rotation.

One end of links 44 are integrally secured on the pieces 1a, the other end portion of which are formed with cam followers 46 engaged in cam grooves 43a. A block 43 having grooves 43a are fixed to the upper end of the shaft 5. As the shaft 5 slidingly ascends, cam followers 46, following the motion of the shaft 5, move along the grooves 43a, so that the links 44 are horizontally moved along guides 90 to cause the chuck pieces 1a to release the wafer. More particularly, only when the rotary shaft 6 descends, the shaft 5 is allowed to ascend relative to the shaft 6 against the force of the spring 15 due to the provision of a pin 47 provided downwardly of the lowermost end of the shaft 5 so as to enlarge the distance between the chuck pieces 1a as illustrated by solid lines in FIG. 13. Meanwhile, when the shaft 6 ascends, the pieces 1a are made to approach each other by the force of the spring 15 as indicated by imaginary lines in FIG. 13, in order to hold the wafer.

Figure 14:
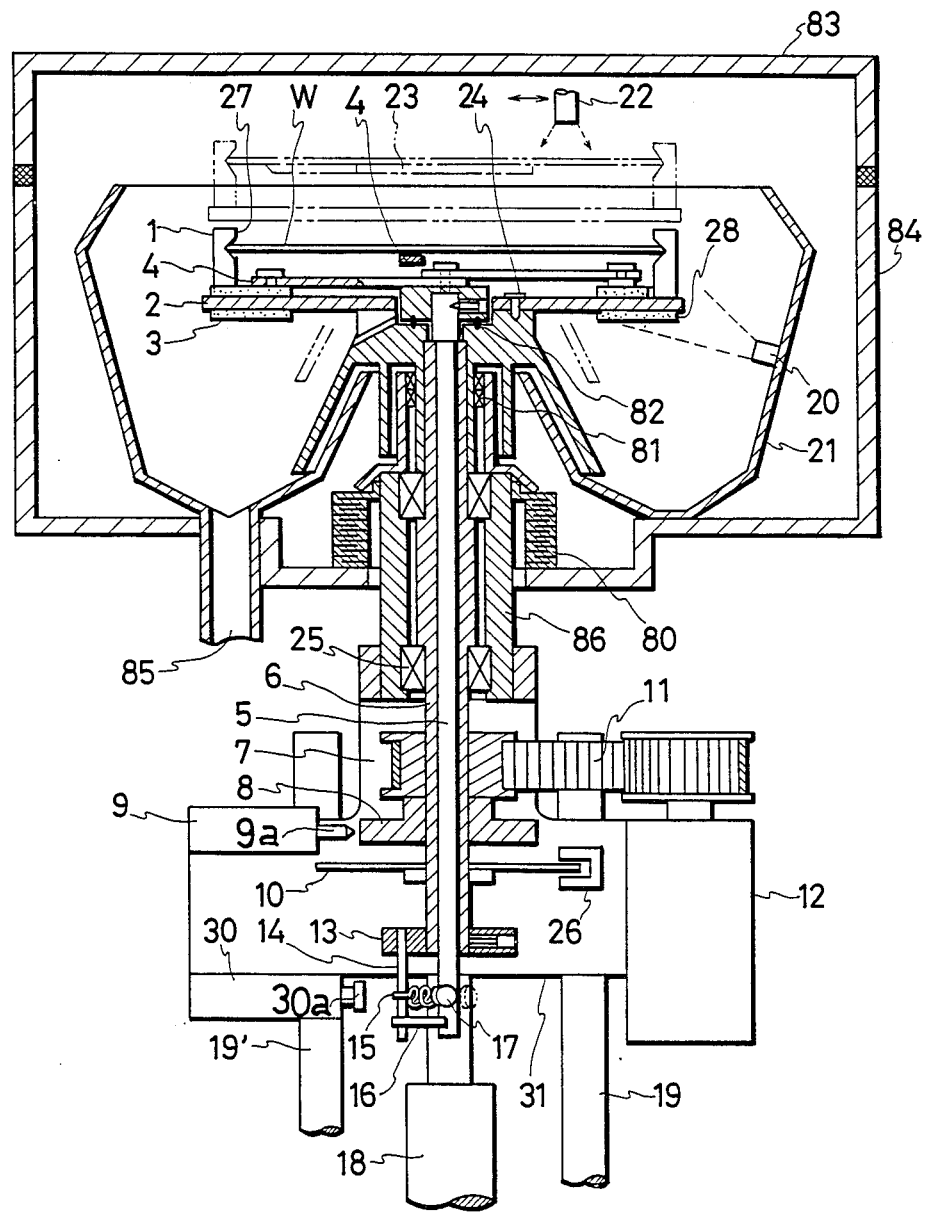
FIG. 14 is a vertical sectional view illustrating an example of cases where the mechanism according to the invention is applied in a vacuum type apparatus for surface treating the wafers.

FIG. 14 is a vertical sectional view illustrating an example of cases where the wafer holding mechanism is applied in a vacuum type apparatus for surface treating the wafers, in which like reference marks designate like or corresponding parts of the mechanisms of FIG. 1.

Reference numeral 84 denotes a casing of the apparatus, 83 a cover closingly provided for sealing the casing 84, 85 a drain pipe for vacuum-suction, and 80 a bellows for effecting sealing between the bottom wall of the casing 84 and a bushing 86 for the rotary shaft.

When the cylinder 18 ascends and descends to move the bushing 80 up and down, the sealing of the casing can nevertheless be maintained by the stretching and contracting motions of the bellows 80. Moreover, a sealing member 81 such as an oil seal is insertingly mounted between the shaft 6 and the bushing 86, and further another sealing member 82 such as an O ring is interveningly mounted between the shafts 5 and 6.

Thus, the arrangement as above makes it to possible to apply the mechanism according to the invention also to the vacuum type surface treating apparatus.

While the preferred embodiments of the present invention have been described above, it should be understood that various modifications may be made herein without departing the spirit of the invention and scope of the appended claims.

What is claimed is:

1. A wafer holding mechanism in an apparatus for surface treating wafers while rotating the same, said mechanism comprising:
   a housing defining a treating chamber in said apparatus;
   a hollow rotary shaft having an upper end thereof extending into said housing;
   a rotary plate member horizontally mounted on said upper end of said rotary shaft and including at least three radially projecting arms;
   chuck members provided on respective said arms for holding an outer peripheral edge of a wafer at least one of said chuck members being horizontally movable in the general direction of its respective said arm;
   a shaft insertingly mounted in said rotary shaft and being rotatable relative to said rotary shaft for driving said chuck member to hold the wafer;
   a link member having one end thereof connected to an upper end of said driving shaft eccentrically to a rotary axis of said driving shaft and the other end thereof linked with said movable chuck member;
   means associated between lower portions of said rotary and driving shafts for urging said driving shaft to rotate relative to said rotary shaft in a direction to drive said movable chuck member to hold the wafer through said link member; and
   means disposed adjacently to said urging means for forcing said movable chuck member to release the wafer, said forcing means being actuated to rotate said driving shaft in a direction reverse to said direction in which said driving shaft is urged to rotate by said urging means.

2. A wafer holding mechanism as claimed in claim 1, wherein said movable chuck member is secured to a sliding member which is slidably mounted along its respective said arm and linked with the other end of said link member, while the other chuck members are fixed on their respective said arms, and further a balancing member of the same weight as that of said sliding member is disposed symmetrically with said sliding member relative to said rotary axis of said driving shaft and mounted slidably along one of said arms.

3. A wafer holding mechanism as claimed in claim 2, wherein said balancing member is linked with one end of another link member the other end of which is connected with said one end of said link member on said upper end of said driving shaft.

4. A wafer holding mechanism as claimed in claim 1, wherein said chuck members are different in height, and there are provided wafer placing pins radially inwardly of a circle defined by ends of all said arms relative to said chuck members.

5. A wafer holding mechanism as claimed in claim 1, wherein said urging means comprises a spring connected between pins formed on said lower portions of said rotary and said driving shafts for perpetually pulling both said pins towards each other to give force to rotate said driving shaft relative to said rotary shaft.

6. A wafer holding mechanism as claimed in claim 1, wherein said forcing means comprises an air cylinder for pushing a pin formed on said lower portion of said driving shaft to rotate said driving shaft relative to said rotary shaft in said reverse direction.

7. A wafer holding mechanism as claimed in claim 1, wherein said forcing means comprises a cam member disposed beneath a lowermost end of said driving shaft for engaging a follower formed on said lower portion of said driving shaft as said rotary shaft descends, so as to rotate said driving shaft relative said rotary shaft in said reverse direction.

8. A wafer holding mechanism as claimed in claim 1, wherein said movable chuck member is rotatable relative to said arm and is fixed to a swinging member which is connected to the other end of said link member whereby said movable chuck member is rotated to hold said wafer by said swinging member when said swinging member is swung in association with a rotation of said driving shaft via said link member.

9. A wafer holding mechanism as claimed in claim 8, wherein said movable chuck member includes a wafer placing part and a chuck part.

10. A wafer holding mechanism as claimed in claim 9, wherein said chuck part of said movable chuck member is formed with cut-outs.

11. A wafer holding mechanism as claimed in claim 9, wherein said chuck part of said movable chuck member is in the shape of a substantially small column formed on said placing part eccentrically to a rotary axis of a body of said movable chuck member.

12. A wafer holding mechanism in an apparatus for surface treating wafers while rotating the same, said mechanism comprising:
   a housing defining a treating chamber in said apparatus;
   a hollow rotary shaft having an upper end thereof extending into said housing;
   a rotary plate member horizontally mounted on said upper end of said rotary shaft;
   at least three chuck members provided on said plate member for holding a wafer, at least one of said chuck members being movable generally radially of and along said plate member;
   a shaft insertingly mounted in said rotary shaft and being rotatable relative to said rotary shaft for driving said movable chuck member to hold said wafer;
   a link member having one end thereof connected to an upper end of said driving shaft eccentrically to a rotary axis of said driving shaft and the other end thereof linked with said movable chuck member;
   means associated between lower portions of said rotary and driving shafts for urging said driving shaft to rotate relative to said rotary shaft in a direction to drive said movable chuck member to hold the wafer through said link member; and
   means for forcing said movable chuck member to release the wafer, said forcing means being actuated to rotate said driving shaft in a direction reverse to said direction in which said driving shaft is energized to rotate by said energizing means.

13. A wafer holding mechanism as claimed in claim 12, wherein said movable chuck member is secured to a sliding member which is slidably mounted radially of and along said rotary plate member and is linked with the other end of said link member, while the other chuck members are fixed on said plate member, and further including a balancing member of the same weight as that of said sliding member which is disposed symmetrically with said sliding member relative to said rotary axis of said driving shaft and slidably mounted radially of and along said plate member.

14. A wafer holding mechanism as claimed in claim 13, wherein said balancing member is linked with one end of another link member the other end of which is connected with said upper end of said driving shaft eccentrically to said rotary axis of said driving shaft.

15. A wafer holding mechanism as claimed in claim 13, wherein said movable chuck member vertically extends with a clearance through an opening formed in said plate member and is fixed on said sliding member, and said balancing member has a pin vertically extending with a clearance through another opening formed in said plate member.

16. A wafer holding mechanism in an apparatus for surface treating wafers while rotating the same, said mechanism comprising:

a housing defining a treating chamber in said apparatus;

a hollow rotary shaft having an upper end thereof extending into said housing;

a rotary plate member horizontally mounted on said upper end of said rotary shaft;

chuck members disposed symmetrically relative to a rotary axis of said rotary shaft for holding an outer peripheral edge of a wafer, at least one of said chuck members being slidably mounted radially of and along said plate member;

a shaft insertingly mounted in said rotary shaft and being movable axially of and relative to said rotary shaft for driving said chuck members;

a cam member mounted on an upper end of said driving shaft;

a link member having formed at one end thereof a cam follower engaged with said cam member and the other end thereof fixed to said chuck member, said link member being horizontally moved along said plate member integrally with said chuck member as said follower follows an axial motion of said driving shaft relative to said rotary shaft engagingly with said cam member;

means associated between lower portions of said rotary and driving shafts for urging said driving shaft relative to said rotary shaft in a direction to cause said chuck members to hold the wafer; and means mounted at lower end of said driving shaft for forcing said chuck member to release the wafer through said link member when said driving shaft moves axially of and relative to said rotary shaft.

17. A wafer holding mechanism as claimed in claim 16, wherein said urging means comprises a spring connected between said lower portions of said rotary and driving shafts for pulling both said portions toward each other axially of said rotary shaft.

18. A wafer holding mechanism as claimed in claim 16, wherein said forcing means comprises a pin projecting downward of said lower end of said driving shaft.

19. A wafer holding mechanism as claimed in claim 16, wherein opposite two of said chuck members are formed on sliding members mounted slidably radially of and along said rotary plate member.

20. A wafer holding mechanism in an apparatus for surface treating wafers while rotating the same, said mechanism comprising:

a housing defining a treating chamber in said apparatus;

a hollow rotary shaft extending into said housing;

a rotary plate member located in said housing and horizontally mounted on said rotary shaft;

chuck members moveable between a gripping position wherein they contact an outer peripheral edge of a wafer and hold the wafer within the housing and a release position wherein the wafer may be removed from the housing, at least one of said chuck members being horizontally movable along said plate member;

a driving shaft located within said rotary shaft and movable relative thereto;

a link member coupling said driving shaft to said movable chuck members, said chuck members moving between said gripping and release positions in response to the relative movement of said rotary and driving shafts between first and second positions;

means for urging said rotary and/or driving shafts into said first position, thereby causing said chuck members to move into said gripping position; and means located outside of said housing for moving said rotary and/or driving shafts into said second position relative to one another, and thereby moving said chuck members into said release position, when said wafer is to be placed onto or removed from said housing.

* * * * *